United States Patent Office 3,526,504

Patented Sept. 1, 1970

3,526,504

PHOTOCROSSLINKABLE ELEMENTS AND PROCESSES

Jack Richard Celeste, Westfield, N.J., assignor to E. I. du Pont de Nemours and Company, Wilmington, Del., a corporation of Delaware No Drawing. Filed July 7, 1966, Ser. No. 567,799
Int. Cl. G03c *5/00*
U.S. Cl. 96—35.1 16 Claims

ABSTRACT OF THE DISCLOSURE

A process which comprises (1) laminating to a solid surface a substantially dry, solid flexible layer of a uniformly photocrosslinkable organic polymer composition having low to moderate adhesion to a flexible polymer film support that is transparent to actinic radiation; (2) exposing selected areas of said layer to actinic radiation to form a crosslinked polymer image in said layer; (3) removing the support as a support from the resulting image-bearing layer laminated to said surface; and (4) removing the unexposed areas by means of a liquid to form a resist image on said surface. The process is useful for imagewise modification of glass, ceramic and metal surfaces and for making printed circuits.

This invention pertains to photocrosslinkable polymer resist-forming elements and to processes of making and utilizing the same.

Commonly used commercial processes for making image resists involve either photoresists which are applied as liquids or which require one or more liquid operations in addition to removal of the resist by liquids. Commonly used liquid photo-resists include dichromates, azo compounds or cinnamoyl esters attached to or used in conjunction wtih polymeric binders. Gelatino-silver halide films have been proposed as photoresists, but these are not directly insolubilized during exposure and therefore require one or more wet chemical processing steps prior to wash-out of unexposed areas. The properties of dichromate-sensitized processes whether applied as liquids or used in the "carbon tissue" process vary greatly with humidity and they cannot be presensitized because of the stability of dichromates even in the absence of actinic radiation.

In assignee's U.S. applications, Celeste, Ser. No. 477,016, filed Aug. 3, 1965, (now abandoned) and Schoenthaler, Ser. No. 451,300 filed Apr. 27, 1965, (U.S. 3,418,-295 issued Dec. 24, 1968) there are disclosed elements for making photoresists which do not require liquid sensitization or application operations. These elements involve a photopolymerizable layer containing an ethylenically unsaturated compound having low to moderate adherence to a film support and may be provided with a protective film or membrane. The latter is removed and the layer is laminated to the surface to be provided with an image and then exposed. After imagewise exposure, the unexposed areas of the layer are washed away leaving a resist image. Except for the washing step, the process is a wholly dry one and requires no liquid operations.

The present invention provides new processes and photosensitive elements that can be used in place of those described in the aforesaid U.S. applications.

This invention in one of its broader aspects is a process which comprises laminating to a solid surface a substantially dry, flexible photosensitive layer of a uniformly photocrosslinkable organic polymer composition having low to moderate adhesion to a flexible polymer film support. The support may be transparent or opaque to electromagnetic or actinic radiation and the surface preferably is inorganic.

The invention will be further described first with reference to a process for the imagewise modification of solid surfaces, e.g., glass, ceramic, metal oxide, anodized aluminum and metal surfaces, for example, copper surfaces. The process comprises:

(1) Laminating to a solid surface a solid photosensitive flexible layer of a photocrosslinkable, organic polymer composition having low to moderate adhesion to a flexible polymer film support that transmits appropriate radiation to which the layer is photosensitive. Laminating may occur with pressure alone. In addition said layer may be heated during or following lamination at a temperature from 40° C. to about 150° C. to increase the degree of adherence between said surface and said layer; then, in either order;

(2) Exposing selected areas of said layer to actinic radiation to form a crosslinked polymer image in said layer;

(3) Removing the film support as a film (i.e. mechanically stripping it) from the resulting image-bearing layer; and (4) Removing the unexposed areas by means of a liquid to form a resist image on said surface.

The unprotected surface can then be modified and utilized in various manners. Thus, it can be treated with a suitable fluid reactant to form an etched surfa ce or metal plated, anodized, colored, coated or processed in other manners. The crosslinked polymer image can then be removed from the surface by scraping or by means of a solvent therefor using solvent action only or with additional mechanical action, e.g. by force-spraying, rubbing, brushing, and/or abrading or by a combination of two or more of these means.

The photocrosslinkable layer preferably has a thickness of 0.00005 to 0.003-inch or more, and the support and protective film, if used. a thickness of 0.00025 to 0.005-inch or more.

Photocrosslinkable elements useful in accordance with the invention can be made by coating a solution or dispersion of the photocrosslinkable organic polymer onto a thin flexible smooth film base or support and drying the layer by removal or evaporation of any volatile solvent or diluent. The support preferably is transparent to actinic radiation, and has good strength, dimensional stability to temperature changes, and is resistant to solvent action by common solvents. The film base should be chosen so that, at best, there is only a moderate amount or degree of adherence between the coating and the support so that the latter can be readily stripped in dry condition from the photocrosslinkable organic polymer coating or layer.

The protective film, if used, should have a lesser degree of adherence to the layer than the support. This protective film or sheet can be applied by pressing or laminating, e.g. by passing the sheet and the coated photocrosslinkable element between rolls.

In making novel photocrosslinkable elements of the invention comprising a sheet or stratum having a continuous surface that is in surface contact with the photocrosslinkable layer on the adherent film support, the protective sheet or film, if used, is first removed from the photocrosslinkable layer and the latter layer brought into surface contact with said continuous surface. This can be done by a pressing or laminating procedure as described in the preceding paragraph for applying the protective film or sheet.

The photocrosslinkable compositions of this invention when light-activated can form no more than one crosslink per photochemical event in contrast to the photopolymerizable compositions of the above-identified Celeste and Schoenthaler applications which can involve chain processes leading to multiple crosslinks. Suitable photocrosslinkable compositions which are useful in the invention include photodimerizable materials such as cinnamic acid esters of high molecular weight polyols, polymers having chalcone and benzophenone type groups or other materials as disclosed in Chaper 4 of "Light-Sensitive Systems' by Jaromir Kosar published by John Wiley & Sons, Inc., New York. These compounds form crosslinks directly under the influence of actinic light with or without additional sensitizers as well as high molecular weight materials which can form crosslinks through a separate light-sensitive species. This latter class includes high molecular weight materials as polyacrylic and polymethacrylic acid amides and derivatives thereof, polymeric polyols, natural colloids such as gelatin, glue, shellac, etc., in combination with light-sensitive crosslinking agents such as metal dichromates, diazo compounds and azides. Other suitable materials may be found in Chapters 2, 6 and 7 of the above Kosar reference. Suitable such materials are described in U.S. patents Minsk, et al., 2,670,286, Feb. 23, 1954; Bradley, 2,379,413; and McQueen, 2,299,839. Additional suitable polymer compositions are available commercially as "Dynachem Photo Resist" material.

In case of the foregoing material no additional macromolecular binder is necessary. However, if desired, there can be used the binders described in the photopolymerizable elements of Plambeck, U.S. Pat. 2,760,863. In addition, plasticizers, colorants (dyes and pigments), fillers, etc. as described in said patent can be used.

In practicing a preferred embodiment of the invention, an element containing an image-yielding photocrosslinkable stratum is made by coating a layer of the photocrosslinkable composition disclosed in U.S. Pat. 2,670,286 on a suitable transparent film support. After drying the photocrosslinkable layer, there is laminated to the surface thereof a removable cover film. The photocrosslinkage composition is coated to give a dry coating thickness of about 0.0003-inch, although this may be varied readily from 0.0001 or less to 0.0005-inch or more. A suitable support film may be chosen from a wide variety of films or foils composed of metals or high polymers, e.g., polyamides, polyolefins, polyesters, vinyl polymers, and cellulose esters and may have a thickness of from 0.00025-inch to 0.005-inch or more. If exposure is to be made before removing the support film, it must, of course, transmit a substantial fraction of the actinic radiation incident upon it. If the support film is removed prior to exposure, no such restrictions apply. A particularly suitable film is a transparent polyethylene terephthalate film having a thickness of about 0.001-inch. Suitable removable cover films, if used, may be chosen from the same group of high polymer films described above and may have the same wide range of thicknesses. A cover film of 0.001-inch thick polyethylene is especially suitable. Support and cover films as described above provide good protection to the photopolymerizable resist layer. To apply the resist to, say, a copper-clad fiber glass rigid support to be used as a printed circuit, the cover film, if used, is stripped from the element and the resist layer on its supporting film is then laminated with heated resilient pressure rolls to the copper surface of the rigid support. This provides a sensitized surface ready immediately for exposure but still protected from dirt, lint and abrasion by virtue of the original support film. To produce a resist image the element is exposed imagewise preferably through the support film and said support is then peeled off and the exposed resist developed by washing away the unexposed areas with solvent which results in a rigid support bearing a relief resist image on its surface. This element may then be subjected to the conventional operations of plating, etching, etc. as is well known to those skilled in the arts using resist images. As stated previously, the support film may be removed prior to said exposure.

The invention will be further illustrated in and by the following examples:

EXAMPLE I

A polyvinyl cinnamate was made in the manner described in Minsk, et al. U.S. Pat. 2,670,286, Feb. 23, 1954, and this was incorporated in a coating composition of the following formula:

| | G. |
|---|---|
| Polyvinyl cinnamate | 5.7 |
| 2-t-butylanthraquinone | 0.3 |
| Methyl ethyl ketone to make | 60.0 |

The solution was coated on a sheet of 0.001-inch thick polyethylene terephthalate transparent film to give a dry coated thickness of about 0.002-inch. After drying, the surface of the coating was laminated to a piece of clean 1 oz./sq. ft. copper clad, epoxy fiber glass board using pressure rolls heated to 120° C. The copper surface of said board was cleaned by scouring with an abrasive cleaner, swabbing and thoroughly rinsing in water. It was then given a 20-second dip in a dilute hydrochloric acid solution (2 volumes water +1 volume conc. hydrochloric acid), a second rinse with water and then dried with air jets. The laminated element was exposed for 18 minutes to ultraviolet radiation through an image-bearing transparency on a plate exposure device (a "Nu Arc" Plate Maker, flip-top, Model FT-26M-2). This device uses a carbon arc as a source of actinic radiation. The transparent film was stripped from the exposed layer and the exposed layer was then developed by placing it in trichloroethylene vapor spray for 30 seconds. This removed the unexposed areas of the photoresist layer to leave a resist image satisfactory for ferric chloride ethcing of the copper. The resist bearing copper sheet was then treated for 30 seconds with 5% ferric chloride solution, washed thoroughly, rinsed in 15% HCl solution, rinsed again in water and finally electroplated for 15 minutes with a 60/40 tin-lead alloy from a fluoborate solder plating bath at room temperature, pH less than 1.0 and a current density of 25 amperes/sq. ft. with 60/40 tin-lead anodes. The unprotected portions of the etched copper were thereby plated with a dense uniform layer of tin/lead alloy.

The exposed areas of the resist were next removed from the copper by brushing with methylene chloride. The copper was then etched in areas not protected by the solder using 3 N aqueous ammonium persulfate containing $10^{-3}$ M mercuric chloride. A pattern in the form of solder plated copper corresponding to the opaque areas of the transparency was left on the fiber glass/epoxy board. A highly satisfactory printed circuit was obtained. This example was repeated except that before exposure the transparent film was peeled from the resist surface. The results were identical.

EXAMPLE II

A photosensitized polyvinyl cinnamate solution (commercially available as Kodak Photo Resist KPR) was coated onto 0.001-inch thick polyethylene terephthalate film and dried. Dry thickness was 0.21 mils. The dry coating was then laminated to the cleaned copper surface of a copper-clad epoxy fiber glass board by means of heated rollers operating at 120° C. and at 2 feet per minute, and 2 lbs. force per inch of nip length. The resist was then exposed 60 sec. to a 45-ampere carbon arc, 18 inches distance, through an image-bearing transparency and said film. After exposure, the polyethylene terephthalate film was peeled from the resist surface and the image was developed in a trichloroethylene vapor spray degreaser. Development washed away the unexposed areas of the polymer resist leaving a relief image corresponding to the transparent areas of the transparency on the copper surface.

The resist bearing copper sheet was then treated with 5% ferric chloride solution, washed thoroughly, rinsed in 15% aqueous HCl solution, rinsed again in water, and finally electroplated for 15 minutes with 60/40 tin-lead alloy from a fluoborate solder plating bath at room temperature, pH less than 1.0 and a current density of 25 amperes/sq. ft. with 60/40 tin-lead anodes. The unprotected portions of the copper were thereby plated with a dense uniform layer lead-tin alloy.

The exposed areas of the resist were next removed from the copper by brushing with methylene chloride. The copper was then etched in areas not protected by the solder using 3 N aqueous ammonium persulfate containing as a catalyst $10^{-3}$ M mercuric chloride. A pattern in the form of solder-plated copper corresponding to the opaque areas of the transparency was left on the fiber glass/epoxy board. Such a panel is suitable for use as a printed circuit.

EXAMPLE III

A photosensitive composition identified as Dynachem Photo Resist (DCR) manufactured by Dynachem Corp. was coated on 0.0001-inch polyester film by spraying the solution onto the film and drying it. Dry thickness was 0.35 mils. This film was laminated to copper, exposed for 5 seconds, developed, etc. all as in Example I. A relief resist image corresponding to the transparent areas of the exposing transparency was formed as before.

The resist covered panel was then etched with 42° Baume' ferric chloride solution leaving behind only the copper which was covered by the resist image.

The following example demonstrates the use of light-hardenable polymeric materials.

EXAMPLE IV

Twenty grams of a polyamide resin made according to the procedures disclosed in Bradley, U.S. Pat. 2,379,413, July 3, 1945, was mixed in 200 ml. of isopropanol. The mixture was stirred and heated until the polyamide resin was completely dissolved. Then 8 ml. of an aqueous solution saturated with disodium 4,4'-diazidostilbene-2,2'-disulfonate was added with stirring. The resulting dispersion was coated on 0.001-inch thick polyethylene terephthalate film and dried. After drying, the surface of the coating was then laminated to a piece of clean copper clad, epoxy-fiber glass board as described in Example I using pressure rolls heated to 120° C. The laminated element was exposed for 5 minutes through an image-bearing transparency on a plate exposure device (a "Nu Arc" Plate Maker, Flip-Top, Model FT-26-M-2). This device uses a carbon arc as a source of actinic radiation. The polyethylene terephthalate film was stripped off and the unexposed areas washed out with isopropanol. The board was etched as described in Example I to give a satisfactory copper conducting pattern on the fiber glass board.

In the examples, the polyester base was uncoated. However, the hydrophobic copolymer coated polyester bases of Alles 2,779,684 can be used in like manner.

The process of this invention has many advantages. It eliminates the special coating and drying requirements imposed on users of the resists in applying liquid coatings to individual pieces to be imaged. The invention offers a simple and easy method of rapidly applying a highly uniform resist material to an object to be imaged. An object to be imaged can be sensitized and ready for exposure in seconds as opposed to minutes or hours for the conventional methods of forming resists which involve coating and drying at the site of use. In addition, the sensitized object can be completely protected from dirt and abrasion by virtue of the fact that the original support film acts as a protective cover sheet after the resist element is applied to the surface to be imaged. Development is readily carried out and, if a dyed resist film is used, produces a dyed image dirctly without a separated dyeing operation. Dyed layers also facilitate inspection at any stage of the process. The photoresist layers sandwiched between two polymeric films after manufacture can easily be stocked as inventory and easily handled without damage until ready for use. The manufacture of the sandwiched photoresist element is easily carried out with high precision on the continuous web coating machinery well known in the photographic manufacturing industry.

Where it is desired to image a perforated element, the invention provides a method of laying down a resist without plugging the perforation holes as would be the case with liquid coatings. This is important where the holes are used for making soldered connections.

In the process of the present invention, coatings of the resist on its supporting film can be made on precision continuous web coating machinery capable of highly uniform application over large areas. Dryers can remove all solvent from the coatings before the web is wound up. These operations, if carried out under clean conditions, especially if a cover film is laminated to the resist coatings, can produce extremely high quality, dirt-free resist coatings which are completely protected in the sandwich form until use. This also facilitates thorough inspection during manufacture. To make a resist image on, for example, a metal support such as copper, it is only necessary to strip off the laminated cover film and laminate the uncovered surface of the photoresist layer to the metal support. The resist layer is still protected from lint, dust and other kinds of harmful dirt as well as from abrasion, scratches, etc. by the original support film. At the same time, it can be easily exposed through said film. The whole operation of the process of the invention is much less time-consuming and much simpler to carry out by the user than the processes of the prior art.

Many other advantages will be obvious to those skilled in the art of making an etched relief image by means of a photoresist.

The embodiments of the invention in which an exclusive property or privilege is claimed are defined as follows:

1. A process which comprises:

(1) laminating to an etchable solid surface selected from the group consisting of glass, ceramic, metal oxide, metal and anodized aluminum, a substantially dry, flexible, unexposed photosensitive layer of a uniformly crosslinkable organic polymer composition which when light-activated can form no more than one crosslink per chemical event and is incapable of lineal addition polymerization, said layer having low to moderate adhesion to an attached contiguous, flexible polymer film support and lesser adherence to said support than to said surface, and in either order;

(2) exposing selected areas of said layer to actinic radiation to form a crosslinked polymer image in said layer;

(3) removing said support as a support from the resulting image-bearing layer laminated to said surface; and (4) removing the unexposed areas of said layer by means of a liquid to form a resist image on said surface.

2. A process according to claim 1 wherein said surface is an inorganic surface.

3. A process according to claim 1 wherein said surface is a copper surface.

4. A process according to claim 1 wherein said surface is an anodized aluminum surface.

5. A process according to claim 1 wherein said support is a polyethylene terephthalate film.

6. A process according to claim 1 wherein the unprotected areas of said surface are further modified by etching it.

7. A process according to claim 1 wherein unprotected areas of said surface are further modified by depositiing a metal on said areas.

8. A laminated photosensitive element comprising a substantially dry, solid, flexible unexposed photosensitive layer of a uniformly crosslinkable organic polymer composition which when light-activated can form no more than one cross-link per photochemical event and is incapable of lineal addition polymerization; one surface of said layer being coated on, contiguous with, non-pressure applied and having low to moderate adhesion to a flexible polymer film support that transmits actinic radiation and the other surface having lesser adhesion to a uniform, contiguous thin protective, pressure applied, non-image bearing cover film.

9. A strippable, laminated, photosensitive element comprising a substantially dry, solid, flexible, unexposed, photosensitive layer of a uniformly cross linkable, organic polymer composition which, when exposed to actinic radiation, can form no more than one cross link per photochemical event and is incapable of lineal addition polymerization; one surface of said layer having low to moderate adhesion to a flexible polymer film and the other surface having lesser adhesion to a uniform, contiguous, thin, non image-bearing protective film, the cohesive strength of the photosensitive layer being higher than the adhesive bond to either the polymer film or the protective film, so that both are cleanly strippable therefrom, the polymer film and the protective film being dissimilar.

10. An element according to claim 8, wherein the polymer film and protective film are disimilar polymers.

11. An element according to claim 8, wherein the polymer film is polyethylene terephthalate and the protective film is a polyolefin.

12. An element according to claim 8, wherein the polymer film is polyethylene terephthalate and the protective film is polyethylene.

13. A process set forth in claim 1, wherein Step (3) precedes Step (2) and said support is flexible and opaque to actinic radiation.

14. A laminated photosensitive element comprising a substantially dry, solid, flexible unexposed photosensitive layer of a uniformly crosslinkable organic polymer composition which when light-activated can form no more than one crosslink per photochemical event and is incapable of lineal addition polymerization; one surface of layer being contiguous with and having low to moderate adhesion to a flexible polymer film support and the other surface having greater adhesion to a contiguous etchable inorganic surface selected from the group consisting of glass, ceramic, metal oxide, metal and anodized aluminum.

15. An element according to claim 14 wherein said inorganic surface is a metal.

16. An element according to claim 14 wherein said inorganic surface is a metal oxide.

References Cited

UNITED STATES PATENTS

| | | | |
|---|---|---|---|
| 2,386,602 | 10/1945 | Gioseffi | 96—83 X |
| 2,760,863 | 8/1956 | Plambeck | 96—35.1 |
| 3,024,180 | 3/1962 | McGraw | 96—83 X |
| 3,186,844 | 6/1965 | Alles et al. | 96—35.1 X |
| 3,307,950 | 3/1967 | Appelbaum | 96—83 |

OTHER REFERENCES

Kodak Industrial Data Book P–7, "Photosensitive Resists for Industry," 1962, pp. 33, 34, 36, 37, 40, 44, 47.

DONALD LEVY, Primary Examiner

R. E. MARTIN, Assistant Examiner

U.S. Cl. X.R.

96—36, 36.2; 156—233